United States Patent
Bae

(10) Patent No.: US 6,338,052 B1
(45) Date of Patent: Jan. 8, 2002

(54) METHOD FOR OPTIMIZING MATCHING NETWORK OF SEMICONDUCTOR PROCESS APPARATUS

(75) Inventor: Koon Ho Bae, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/104,108

(22) Filed: Jun. 25, 1998

(30) Foreign Application Priority Data

Jun. 27, 1997 (KR) .............................. 97-28454

(51) Int. Cl.[7] .................................. G06N 3/02

(52) U.S. Cl. .............................. 706/15; 706/15; 706/16; 706/23; 706/31; 706/42

(58) Field of Search .............................. 706/15, 16, 31, 706/41, 23; 438/16

(56) References Cited

U.S. PATENT DOCUMENTS

| | | | | |
|---|---|---|---|---|
| 5,443,688 A | * | 8/1995 | Toure et al. ................... | 438/3 |
| 5,453,154 A | * | 9/1995 | Thomas ........................ | 216/18 |
| 5,856,722 A | * | 1/1999 | Haronian et al. ............ | 310/321 |
| 5,910,011 A | * | 6/1999 | Cruse .......................... | 438/16 |
| 6,045,877 A | * | 4/2000 | Gleason et al. ............. | 427/522 |

FOREIGN PATENT DOCUMENTS

| | | |
|---|---|---|
| EP | 0047354 | 3/1982 |
| EP | 0155562 | 9/1985 |
| EP | 0685936 | 12/1995 |
| GB | 2126098 | 3/1984 |
| WO | 9724748 | 7/1997 |
| WO | 9744812 | 11/1997 |

OTHER PUBLICATIONS

Card, J.P.; Sniderman, D.L.; Klimasauskas, C., Dynamic neural control for a plasma etch process, Neural Networks, IEEE Transactions on, vol. 8 4, Jul. 1997, pp. 883–.*

Rietman, E.A., A neural network model of a contact plasma etch process for VLSI production, Semiconductor Manufacturing, IEEE Transactions on, vol. 9 1, Feb. 1996, pp. 95–100.*

Kim, B.; May, G.S., Modeling reactive ion etching of silicon dioxide films using neural networks, Electronic Components and Technology Conference, 1994. Proceedings., 44th, Jan. 1994, pp. 273–278.*

Kim, B.; May, G.S., Reactive ion etch modeling using neural networks and simulated annealing, Components, Packaging, and Manufacturing Technology, Part C, IEEE Transactions on see also Components, Hybrids, and Manufacturing Technology, IEEE Transactions, Jan. 1996.*

Rietman, E.A.; Patel, S.; Lory, E., Neural network control of a plasma gate etch: Early steps in wafer–to–wafer process control, Electronic Manufacturing Technology Symposium, 1993, Fifteenth IEEE/CHMT International , Jan. 1993 , pp. 454–457.*

(List continued on next page.)

Primary Examiner—Mark R. Powell
Assistant Examiner—Wilbert L. Starks
(74) Attorney, Agent, or Firm—Selitto & Associates, P.C.

(57) ABSTRACT

A method for optimizing matching network between an output impedance and an input impedance in a semiconductor process apparatus is disclosed. The method includes the steps of: providing a neural network capable of being trained through repeated learning; training the neural network from previously performed process conditions; setting up an initial value; comparing the initial value with a theoretically calculated value, to obtain error between the values; and repeating the training, setting, and comparing steps until the error becomes zero.

2 Claims, 3 Drawing Sheets

OTHER PUBLICATIONS

Erten, G.; Gharbi, A.; Salam, F.; Grotjohn, T.; Asmussen, J. Using neural networks to control the process of plasma etching and deposition, Neural Networks, 1996., IEEE International Conference on, vol. 2, Jan. 1996, pp. 1091–1096 vol. 2.*

Taek–Beom Koh; Sang–Yeob Cha; Kwang Bang Woo; Dae–Sik Moon; Development of integrated process control system utilizing neural network for plasma etching, Kyu Hwan Kwak; Ho Seung Chang Electronics Manufacturing Technology Symposium, 1995. Manufacturing Te, Jul. 1997.*

* cited by examiner

METHOD FOR OPTIMIZING MATCHING NETWORK OF SEMICONDUCTOR PROCESS APPARATUS

BACKGROUND OF THE INVENTION

The present invention generally relates to a method for optimizing matching network of semiconductor process apparatus by tuning source impedance with load impedance. More particularly, the present invention relates to a method for optimizing matching network of semiconductor process apparatus using neural network.

In many applications of semiconductor process apparatus, power source is connected to electric load. This is to maximize electric power transmitted to load. Such an object can be accomplished when output impedance of power source and input impedance of electric load have a relation of couple complex number to each other theoretically. However, in practical applications where user operates a semiconductor process apparatus, for example, a plasma etcher using radio frequency("RF") or microwave("MW") as power source and process chamber as electric load, probability that output impedance of power source have a relation of couple complex number to each other is poor. Therefore, so as to transmit maximum power to the process chamber, impedance matching network has to be established between the plasma source and the process chamber. Basically, impedance matching network acts as providing to source an impedance corresponding to couple complex number of output impedance and also acts as providing to electric load an impedance corresponding to couple complex number of input impedance. Thus, in impedance matching network are established a variable inductor and a variable capacitor electrically connected to each other. Therefore, in a case a semiconductor process apparatus is in need of impedance matching, it is controlled by complementarily handling the variable inductor and the variable capacitor.

As a merely example, two variable capacitors are established in the matching network of RF plasma source to tune the source with the load. In addition, in case of MW plasma source, three stubs are established in the tuner of the matching network, and is handled to tune impedance with electric load.

In use of such kinds of plasma sources, initial values of the matching network are fixed. For example, in case that RF plasma source is used, initial value of the two variable capacitors are fixed to a first given value, and in case MW plasma source is used, initial values of the three stubs are also fixed to a second given value.

Initial value, however, greatly affects impedance matching between source and load. This is due to difference in initial process recipes according to source electric power, gas pressure, flow rates of reactant gases, or RF power. Accordingly, it is desirable to provide an optimal method for ideal impedance matching.

SUMMARY OF THE INVENTION

Accordingly, it is an object of the present invention to attain ideal impedance matching by automatically designating initial values of recipe for the fabrication of a semiconductor device using neural network.

According to the invention, there is provided a method for optimizing matching network between an output impedance and an input impedance in a semiconductor process apparatus. The method comprises the steps of: providing a neural network capable of being trained through repeated learning; training the neural network from previously performed process conditions; setting up an initial value; comparing the initial value with a theoretically calculated value, to obtain error between the values; and repeating the training, setting, and comparing steps until the error becomes zero.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Hereinbelow, selected embodiments of the present invention will be explained in detail with reference to the accompanying drawings. These drawings are merely illustrations and should not limit the scope of the claims herein. One of ordinary skill in the art would recognize other variations, modifications, and alternatives.

Figure 1:
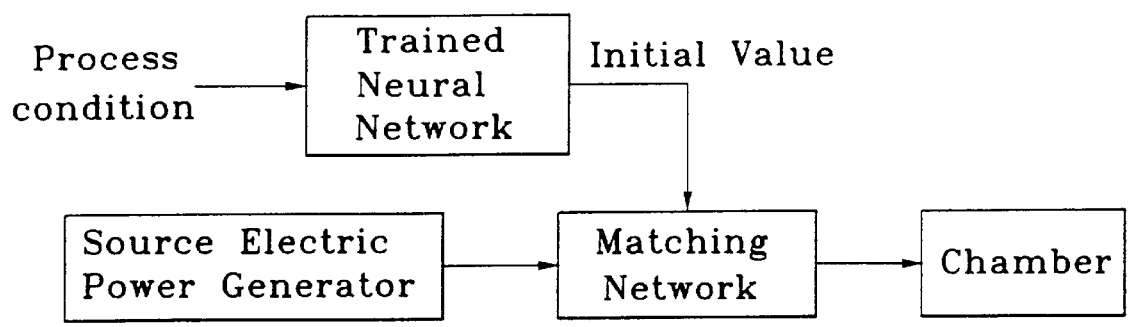
FIG. 1 is a block diagram for explaining impedance matching between source electric power and chamber.

FIG. 1 is a block diagram for explaining impedance matching between source electric power and chamber. Here, as a merely example, the chamber is for dry etcher, but is not limited.

Referring to FIG. 1, there is provided a trained neural network of setting up initial values to perform a process, for example, etching process. The neural network is connected to a matching network. Here, the trained neural network is a software that anticipates initial values for performing etch process from recipes or various process conditions such as source power, gas flow rate, chamber pressure, and bias RF power, and it provides anticipated initial values into the matching network. The neural network is trained by input data. The neural network compares input data and thereby searches relations between the data. Afterwards, the neural network anticipates output on arbitrary input and thereby decreases output error in the neural network or a system to which the neural network is applied.

In the present embodiments, recipes or various process conditions such as source power, gas flow rate, chamber pressure, and bias RF power etc., continue to be inputted into the neural network, and thereby the neural network learns to anticipate optimal initial values for the matching network. Initial values determined from the neural network are inputted into the matching network. The matching network matches impedance of source power generator with impedance of process chamber.

Figure 2A:
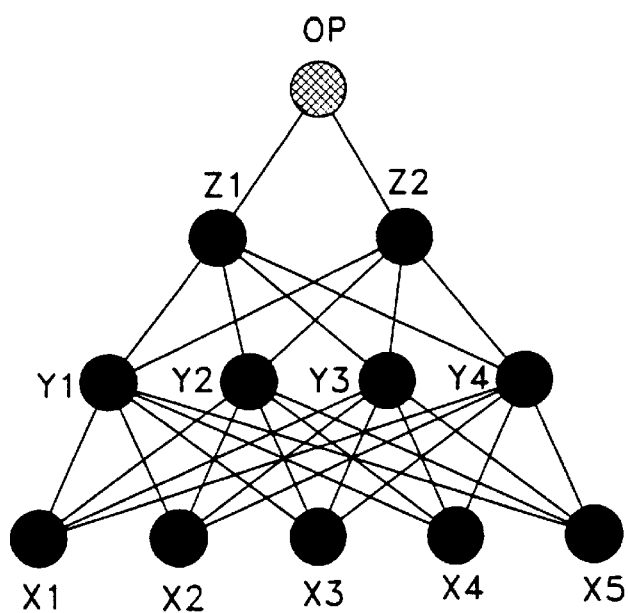
FIGS. 2A and 2B are schematic diagrams of neural network according to embodiments of the present invention.

Next, FIG. 2A is a schematic diagram showing that the neural network determines initial value.

Referring to FIG. 2A, nodes of X1 to X5 of the lowest layer are input data corresponding to various process conditions such as source power, gas flow rate, chamber pressure, and bias RF power etc.,. Nodes Y1 to Y4 are a first hidden layer to obtain first medium values which are determined from data of X1 to X5. In addition, nodes Z1 and Z2 are a second hidden layer to obtain second medium values which are determined from data of Y1 to Y4. Forecast of initial values or output "OP" is mostly performed in these hidden layers. Nodes Y1 to Y4 and Z1 and Z2 of the hidden layers can be compared to neuron of man's brain, and are gradually specified during repeat of learning. For instance, initial value for source power is specified in the node Y1 of the first hidden layer and the node Z1 of the second hidden layer, and initial value for source power is specified in the node Y2 of the first hidden layer and the node Z1 of the second hidden node.

Figure 2B:
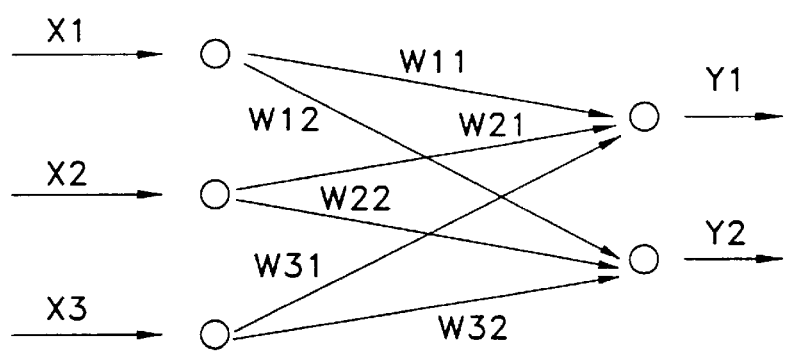

FIG. 2B shows learning process of the first hidden layer.

Referring to FIG. 2B, in an arbitrary hidden layer, weights are respectively given to respective input data of the nodes X1 to X3, and an activation function is set up as follows:

$$Y1=f(X1*W1+X2*W2+X3*W3+X4*W4+X5*W5+\ldots)$$

where weights W1 to W5 are values obtained from repeated learning of input data. The activation function means information specified by the learning of the neural network. Medium values obtained from the activation function continue to be inputted into upper layers. Through such the repeated learning, output value OP is finally obtained.

Figure 3:
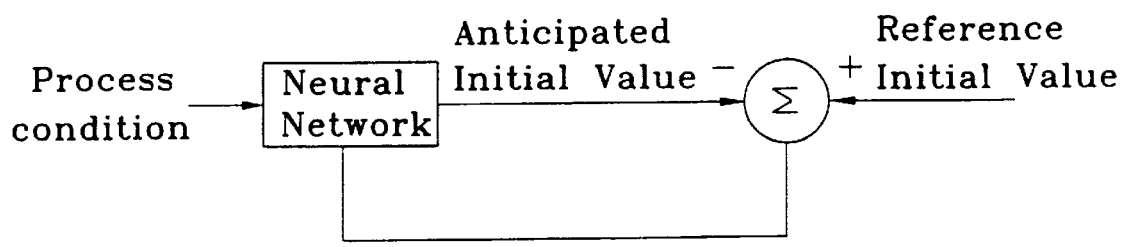
FIG. 3 is a schematic diagram of feedback network for training neural network according to embodiments of the present invention.

In the present embodiments, for the purpose of learning of the neural network, a feedback network is provided as shown in FIG. 3. In further detail, if previously known process conditions are inputted into the neural network, anticipated initial values based on immediately performed learning is outputted. Such anticipated initial values are compared with referenced initial value and thereby error is led. The error is again inputted into a node of upper layer of the neural network.

Figure 4:
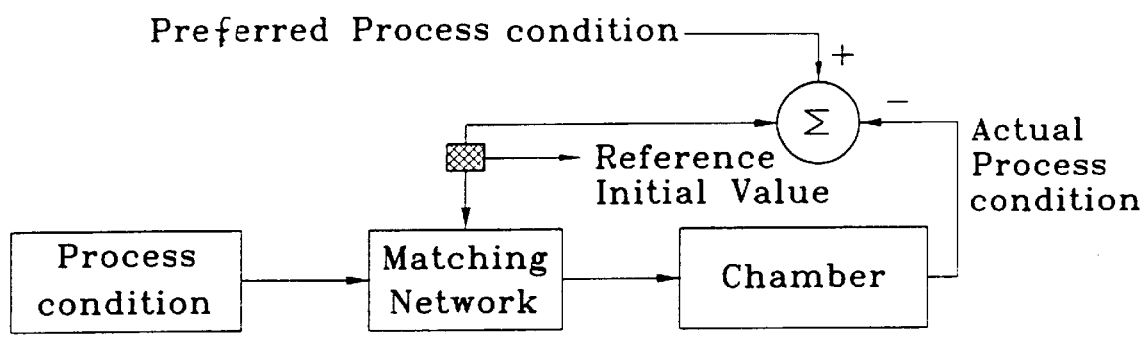
FIG. 4 is a schematic diagram of means for leading an initial value for reference.

FIG. 4 is a schematic diagram showing a process that the neural network leads the referenced initial value of FIG. 3.

Referring to FIG. 4, if initial values determined from the neural network are first inputted into the matching network, the matching network matches impedance of source power generator with impedance of process chamber. Next, output from the process chamber is compared with preferred process condition which is theoretically calculated, and thereby error is obtained. Based on the obtained error, new initial values are again inputted into the matching network, and the matching network secondly matches impedance of source power generator with impedance of process chamber. Next, output from the process chamber is secondly compared with preferred process condition which is theoretically calculated, and thereby second error is obtained. Such the cyclic process continues to be performed until the obtained error becomes zero. The initial values where the error is zero, is set up as the referenced initial values.

As described above, the present invention can attain more precise impedance matching than the conventional impedance matching method by automatically designating initial values anticipated by neural network through repeated learning. In addition, although a new process condition is given, error in designating initial values for the new process can be decreased.

Various other modifications will be apparent to and can be made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for optimizing a matching network between a power source for an output impedance and a chamber for an input impedance in a dry etcher for a semiconductor process, comprising the steps of:

providing a neural network capable of being trained through repeated learning;

training the neural network from previously performed process conditions relating to said power source and said chamber;

setting up an initial value;

comparing the initial value with a theoretically calculated value to obtain an error between the values, and repeating the training, setting and comparing steps until the error becomes zero.

2. The method in claim 1, wherein said process conditions in the training step comprises a source power, a reactant gas flow rate, a chamber pressure, and a bias RF.

* * * * *